(12) United States Patent
Peczalski et al.

(10) Patent No.: US 8,299,506 B2
(45) Date of Patent: Oct. 30, 2012

(54) INTEGRATION OF MEMS AND CMOS DEVICES ON A CHIP

(75) Inventors: Andy Peczalski, Eden Prarie, MN (US); Robert E. Higashi, Shorewood, MN (US); Gordon Alan Shaw, Plymouth, MN (US); Thomas Keyser, Plymounth, MN (US)

(73) Assignee: Honeywell International Inc., Morristown, NJ (US)

( * ) Notice: Subject to any disclaimer, the term of this patent is extended or adjusted under 35 U.S.C. 154(b) by 16 days.

(21) Appl. No.: 12/628,889

(22) Filed: Dec. 1, 2009

(65) Prior Publication Data

US 2010/0140670 A1 Jun. 10, 2010

Related U.S. Application Data

(60) Provisional application No. 61/118,914, filed on Dec. 1, 2008.

(51) Int. Cl.
 *H01L 29/84* (2006.01)
(52) U.S. Cl. ........ 257/254; 257/508; 257/351; 257/690; 438/51; 438/52; 438/702
(58) Field of Classification Search .................. 257/351, 257/254, 508, 734, 690, 415; 438/51–53, 438/702
See application file for complete search history.

(56) References Cited

U.S. PATENT DOCUMENTS

| | | | |
|---|---|---|---|
| 2007/0177127 A1* | 8/2007 | Fujisawa et al. | 355/72 |
| 2008/0318356 A1* | 12/2008 | Onozuka et al. | 438/51 |
| 2009/0231668 A1* | 9/2009 | Maeda et al. | 359/290 |
| 2009/0261416 A1* | 10/2009 | Raberg et al. | 257/351 |

OTHER PUBLICATIONS

Sami Franssila, "introduction to microfabrication" Wiley 2004 ISBN: 0-470-85105-8.*
Piazza, Gianluca, et al., "One and two port piezoelectric higher order contour-mode MEMS resonators for mechanical signal processing", *Solid-State Electronics 51*, www.sciencedirect.com, (2007), 13.
Piazza, Gianluca, "Piezoelectric Aluminum Nitride Vibrating Contour-Mode MEMS Resonators", *Journal of Microelectromechanical Systems*, vol. 15, No. 6, (Dec. 2006), 13.

* cited by examiner

*Primary Examiner* — Kimberly Rizkallah
*Assistant Examiner* — Mark A Laurenzi
(74) *Attorney, Agent, or Firm* — Schwegman, Lundberg & Woessner, P.A.

(57) ABSTRACT

A method of forming CMOS circuitry integrated with MEMS devices includes bonding a wafer to a top surface layer having contacts formed to CMOS circuitry. A handle wafer is then removed from one of the top or bottom surfaces of the CMOS circuitry, and MEMS devices are formed in a remaining silicon layer.

12 Claims, 10 Drawing Sheets

| CROSS SECTION DRAWING | | PROCESS DESCRIPTION |
|---|---|---|
| 810 — SOI #2 (MSI), SOI #1 (SOI), CMOS HANDLE WAFER, POLY-2 SHELL, TUNGSTEN THRU PAD, SOI CMOS DEVICES | | SOI-5 WAFER WITH DOUBLE SOI |
| 812 — CMOS HANDLE WAFER | | ATTACH SOI WAFER TO NEW HANDLE WAFER WITH PBM |
| 814 — MBOX LAYER | | GRIND BACK SOI HANDLE WAFER AND TMAH ETCH TO MBOX LAYER |
| 816 — | | CUT MBOX & DRIE MSI TO PATTERN RESONANT SILICON MASS (MASK 1) |
| 818 — | | TEOS FILL TRENCHES AND CMP TO SILICON SURFACE |
| 820 — | | SEND WAFERS TO BERKLEY FOR AlN PROCESS |
| 822 — | | POLYIMIDE COAT, PATTERN POLYIMIDE (MASK 2) AND SEAL WITH TEOS. |

*Fig. 8*

| CROSS SECTION DRAWING | PROCESS DESCRIPTION |
|---|---|
| 910 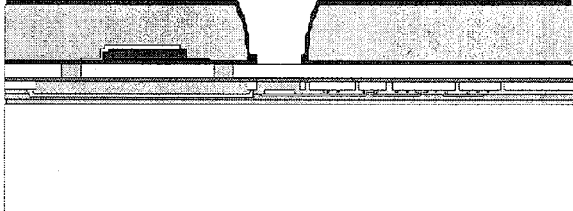 | CUT THRU TEOS AND BERKLEY NITRIDE TO MSI (MASK 3) |
| 912 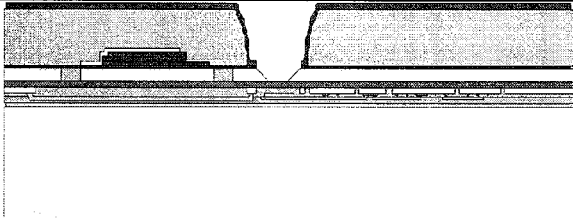 | TMAH ETCH THRU MSI FOR FUTURE PAD CONTACTS. |
| 914 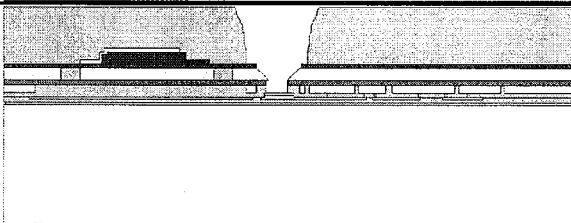 | BLANKET ETCH BACK TEOS TO POLYMIDE AND TUNGSTEN PADS AT BOTTOM OF TMAH VIAS. |
| 916 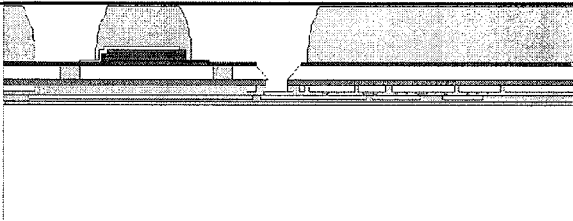 | ETCH BACK POLYMIDE TO EXPOSE PIEZOELECTRIC CONTACTS AND PATHS FOR TETHERS. (MASK 4) |
| 918 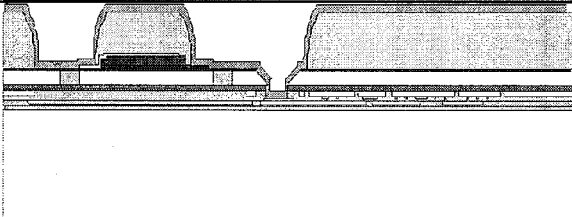 | CAP POLYIMIDE AND SILICON SIDEWALLS WITH SILICON NITRIDE |
| 920 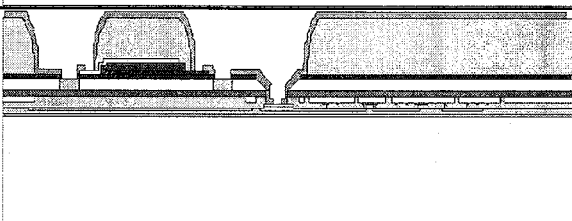 | CUT NITRIDE VIAS TO TUNGSTEN SOI PAD, PIEZOELECTRIC PADS AND OXIDE TRENCHES (DON?T EXPOSE SILICON IN AREAS WHERE TETHER METAL WILL BE (MASK 5) |

Fig. 9

| CROSS SECTION DRAWING | PROCESS DESCRIPTION |
|---|---|
| 1010 | LIFT-OFF DEPOSIT TETHER METAL AND CONTACTS TO CMOS (E-BEAM METAL) (MASK 6) |
| 1012 | HF: WAFER ETCH TO RELEASE STRUCTURE. |
| 1014 | BLANKET NITRIDE ETCH TO EXPOSE POLYIMIDE |
| 1016 | BLANKET O2 PLASMA TO CLEAR POLYIMIDE. DONE!! |

Fig. 10 ion of MEMS and CMOS Devices on a Chip

RELATED APPLICATION

This application claims priority to U.S. Provisional Application Ser. No. 61/118,914 (entitled INTEGRATION OF RADIO FREQUENCY MEMS AND CMOS, filed Dec. 1, 2008) which is incorporated herein by reference.

BACKGROUND

There are many applications of radio frequency circuits integrated with analog and digital CMOS (complementary metal-oxide semiconductor) circuitry that require low power dissipation. They include wireless sensors, airborne and space-borne electronics, any battery operated RF (radio frequency) device e.g. cell phone. However, the RF components like capacitors, inductors, crystal oscillators or surface acoustic wave devices are large and discrete devices. The discrete devices require high operating power and large size and more weight than a single chip solutions. In many cases the reliability suffers when many components are used.

BRIEF DESCRIPTION OF THE DRAWINGS

FIG. 8 is a table illustrating cross sections and process description for forming MEMS devices on a wafer according to an example embodiment.

FIG. 9 is a table illustrating cross sections and further process description for forming MEMS devices on a wafer according to an example embodiment.

FIG. 10 is a table illustrating cross sections and still further process description for forming MEMS devices on a wafer according to an example embodiment.

DETAILED DESCRIPTION

Figure 1:
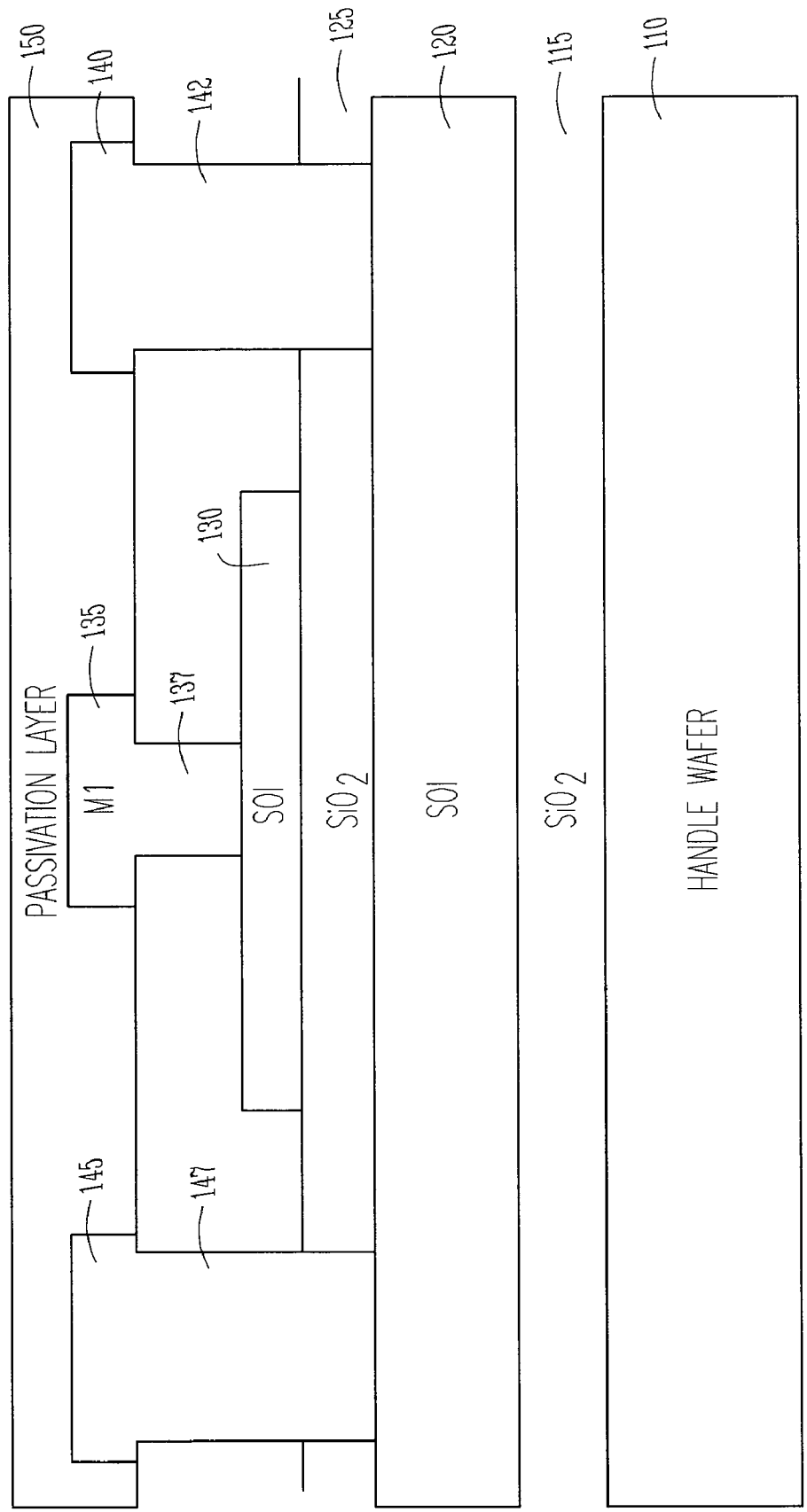
FIG. 1 is a block cross section diagram illustrating wafer preparation according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A commercial CMOS process is integrated with a MEMS (micro electro-mechanical systems or sensors) fabrication process to produce dice that include both CMOS circuitry and MEMS components such as resonators and filters. A bonding of wafer technique is used to attach a finished CMOS wafer from its top side to another wafer such as a high resistivity Si wafer. The original CMOS wafer may then be removed. In one embodiment a MEMS layers is left behind. The steps that follow secure a connection between the top MEMS layer and the CMOS circuitry that is buried below it. The MEMS material, such as Si, SiC, diamond, or other material may then be processed into a desired shape such as a resonator.

In one embodiment, two modifications of the CMOS process include changing the starting wafer from SOI (silicon on insulator) to double Si layer SOI and planarizing a top metal layer. Then a CMOS wafer may be bonded device layer down onto a high resistivity Si wafer using an organic permanent bonding material, also referred to as dielectric polymer thin film used as a bonding glue. In one embodiment, the bonding technique should utilize a temperature of less than 400° C. in order to conserve thermal budget for the CMOS circuitry. Many different materials may be used to bond the wafers in various embodiments, including one from FLARE. The original CMOS wafer is removed down to the MEMS Si layer.

While many different types of MEMS devices may be formed, in one embodiment, various MEMS fabrication processes, such as actuation piezoelectric and metallization may be deposited and patterned. Then the MEMS resonators may be patterned with Deep Reactive Ion Etch (RIE) and the trenches may be filled with oxide as the release layer for the tethers. The vias may be etched through making contact to the first metal layer of CMOS circuits. Finally the tethers are deposited and patterned and the MEMS structures are released. The last steps may be to ash away the polyimide protection layer and clean the MEMS structure surface from any organic or other adsorbed molecules in vacuum.

Various embodiments using the process allow optimization of MEMS independent of the CMOS circuitry formation. Generally, a CMOS circuit is first formed and prepared for bonding with a MEMS wafer, or the use of a double SOI (silicon on insulator) layer to form the MEMS. The original CMOS wafer may then be selectively etched or otherwise removed.

In the figures, two embodiments describing RF MEMS and CMOS substrate preparation are shown and described. The first embodiment shown in FIGS. 1, 2 and 3 use a double SOI for a starting wafer in which the CMOS circuitry is formed. A handle wafer 110 has a first $SiO_2$ layer 115 formed on it, followed by a first silicon on insulator (SIO) layer 120. A further $SiO_2$ layer 125 is formed on first SOI layer 120. A second SOI layer 130 is supported by $SiO_2$ layer 125. CMOS circuitry 135 is formed with a contact 137 to second SOI layer 130, and CMOS circuitry 140 and 145 may be formed with corresponding contacts 142, 147 to first SOI layer 120 in various embodiments as shown in FIG. 1. A passivation layer 150 may be formed over the circuitry and contacts to form a passivated circuit wafer.

Figure 2:
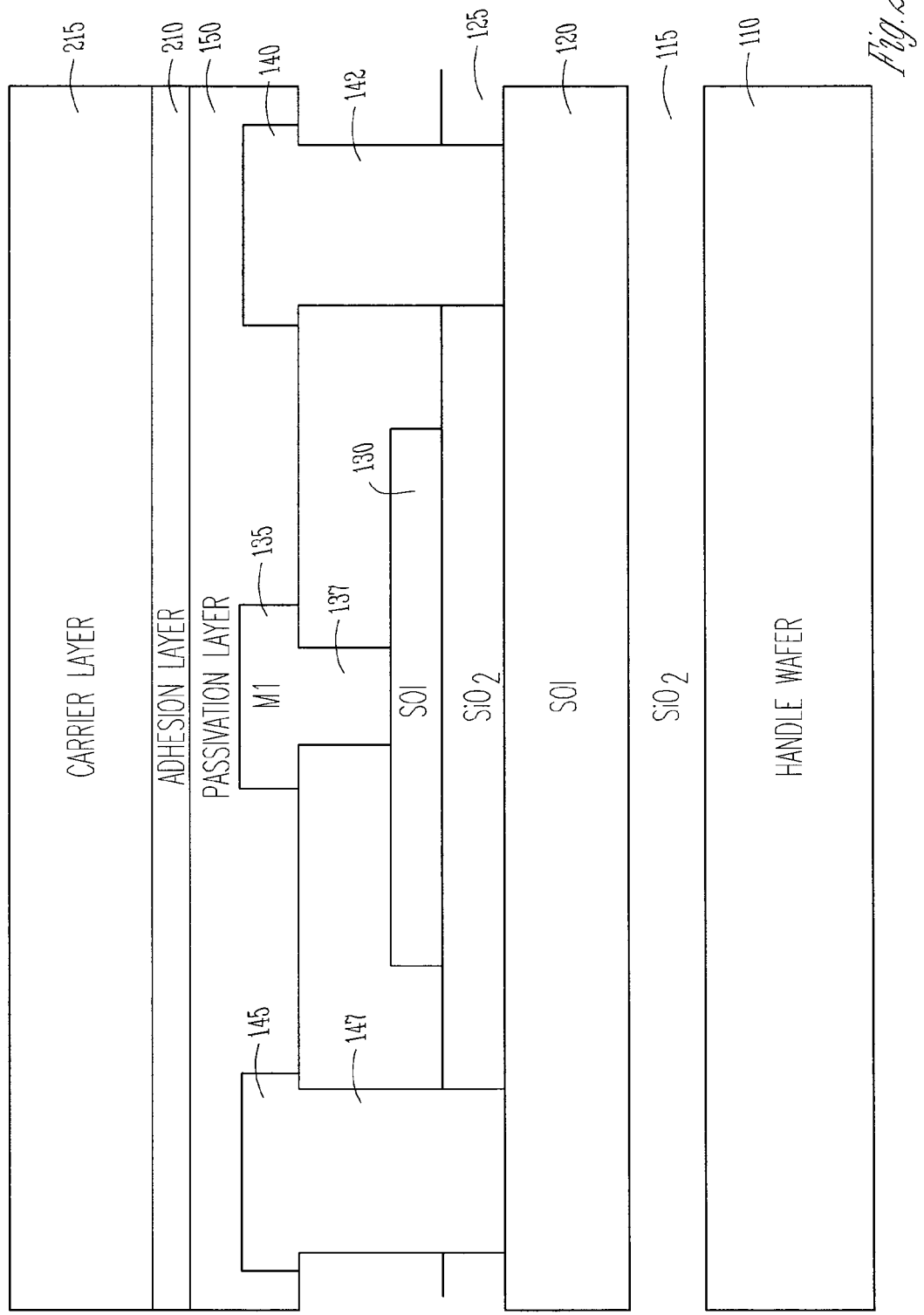
FIG. 2 is a block cross section diagram illustrating further steps in the wafer preparation according to an example embodiment.
Figure 3:
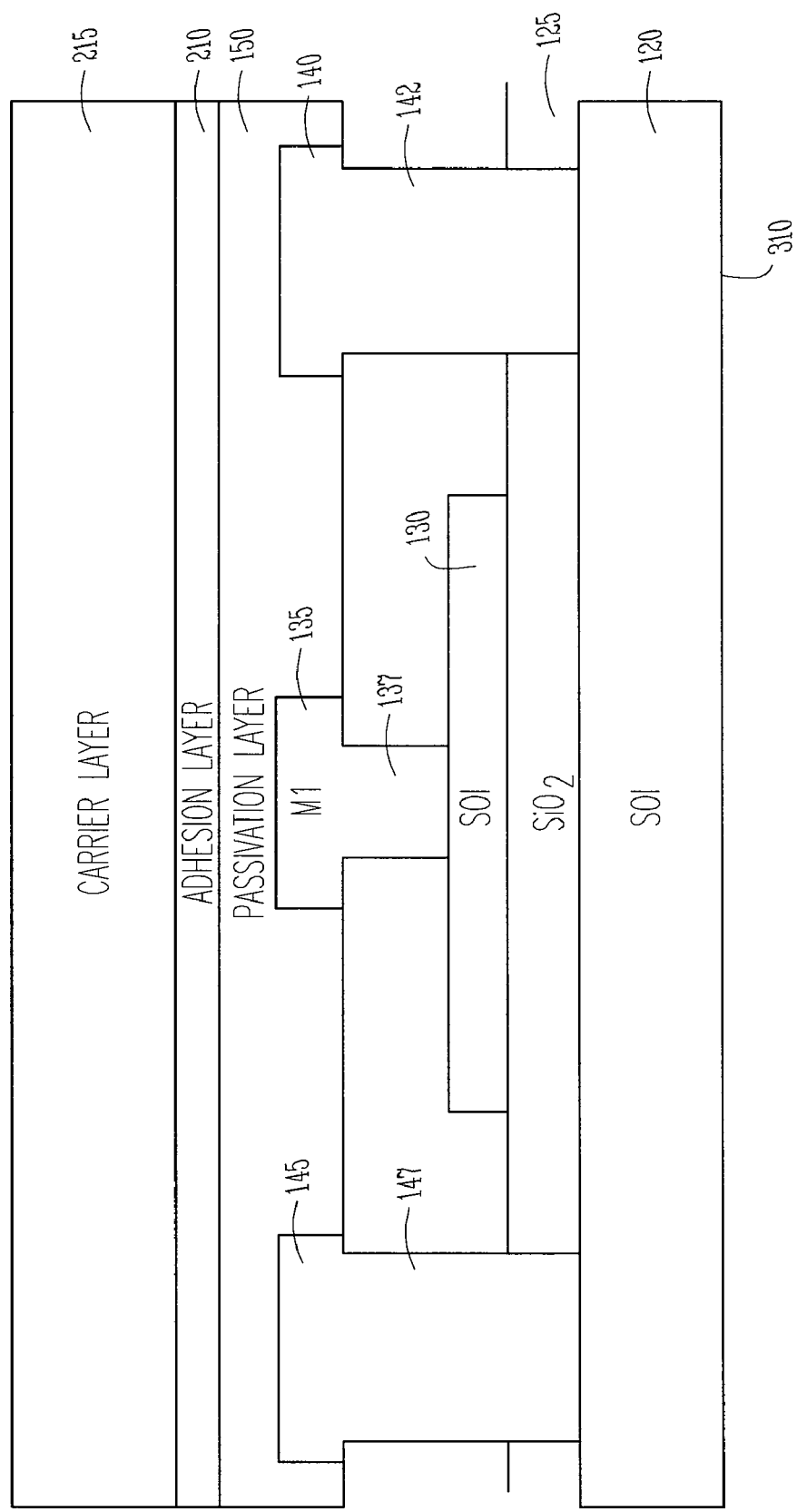
FIG. 3 is a block cross section diagram illustrating further steps in the wafer preparation according to an example embodiment.
Figure 4:
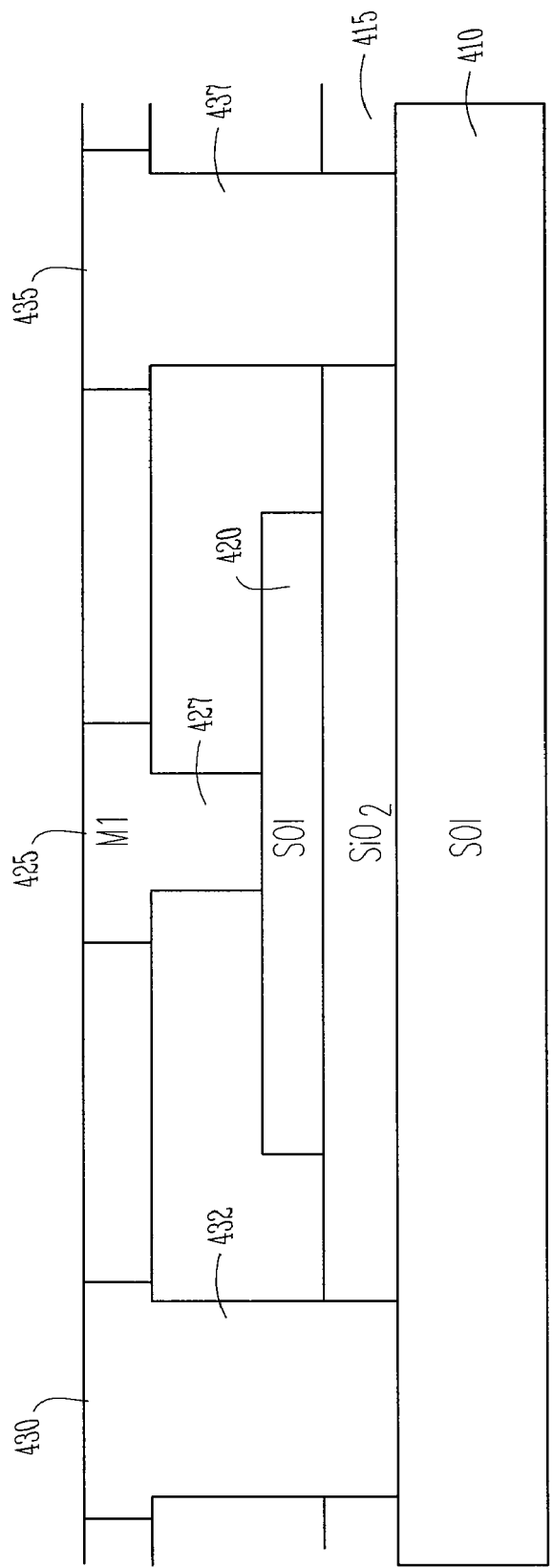
FIG. 4 is a block cross section diagram illustrating an alternative wafer preparation process according to an example embodiment.

In FIG. 2, where the numbering of like parts is consistent with FIG. 1, an adhesion layer 210 is formed on passivation layer 150 and is bonded to a carrier wafer 215. They may be permanently bonded in one embodiment to form a passivated circuit wafer to carrier combination. FIG. 3 illustrates the combination of FIG. 2 with the handle wafer 110 removed such as by a combination of grinding, polishing and etching. The wafer backside 310 is now ready for backside MEMS fabrication.

In the second embodiment of CMOS-MEMS wafer preparation, a handle wafer 410 supports an SiO$_2$ layer 415, followed by an SOI layer 420. CMOS circuitry 425 is then formed with a contact 427 to SOI layer 420. Other CMOS circuitry 430 and 435 with corresponding contacts 432 and 437 to handle wafer 410 may also be formed.

Figure 5:
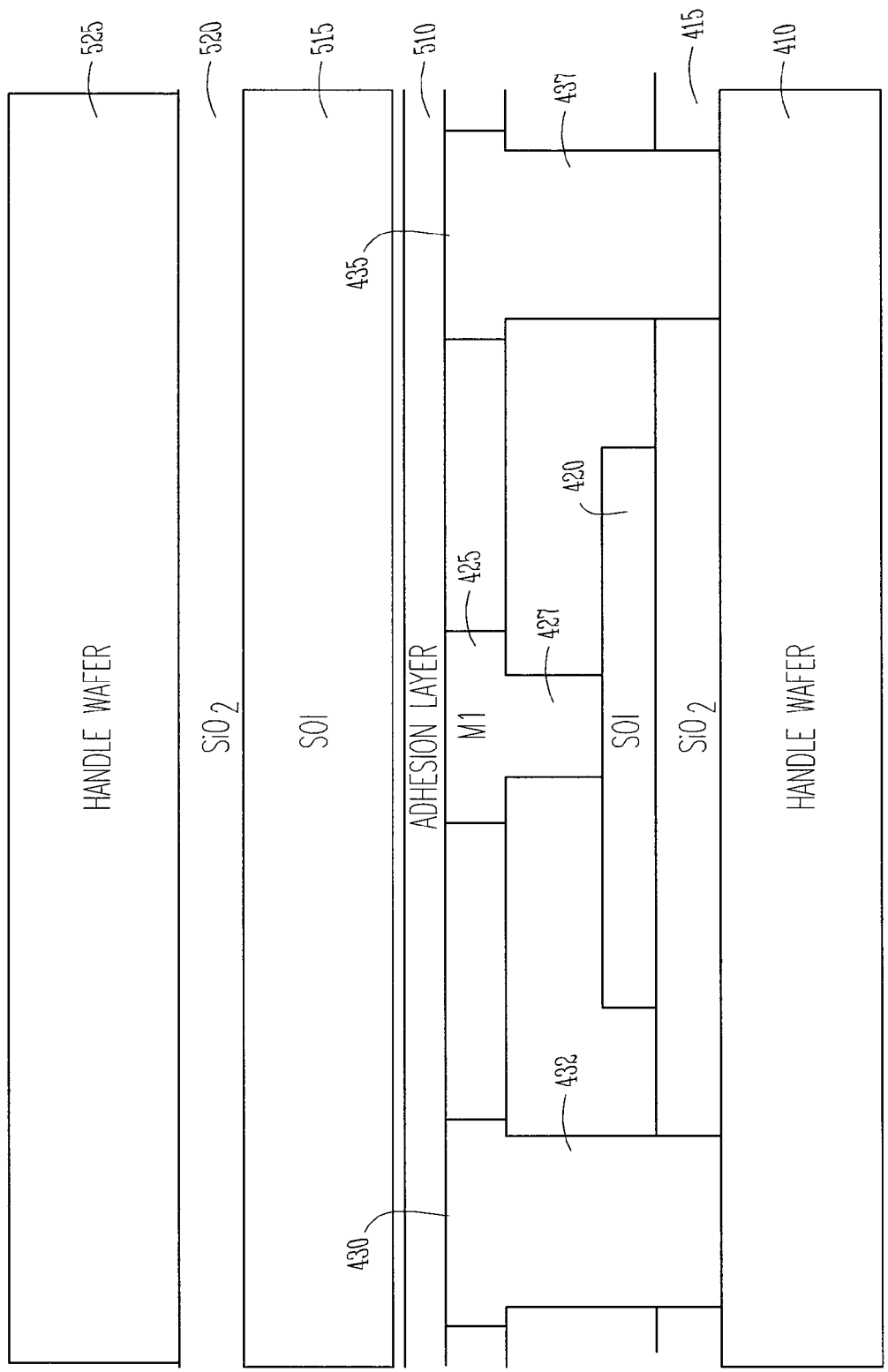
FIG. 5 is a block cross section diagram illustrating further steps in the wafer alternative preparation according to an example embodiment.
Figure 6:
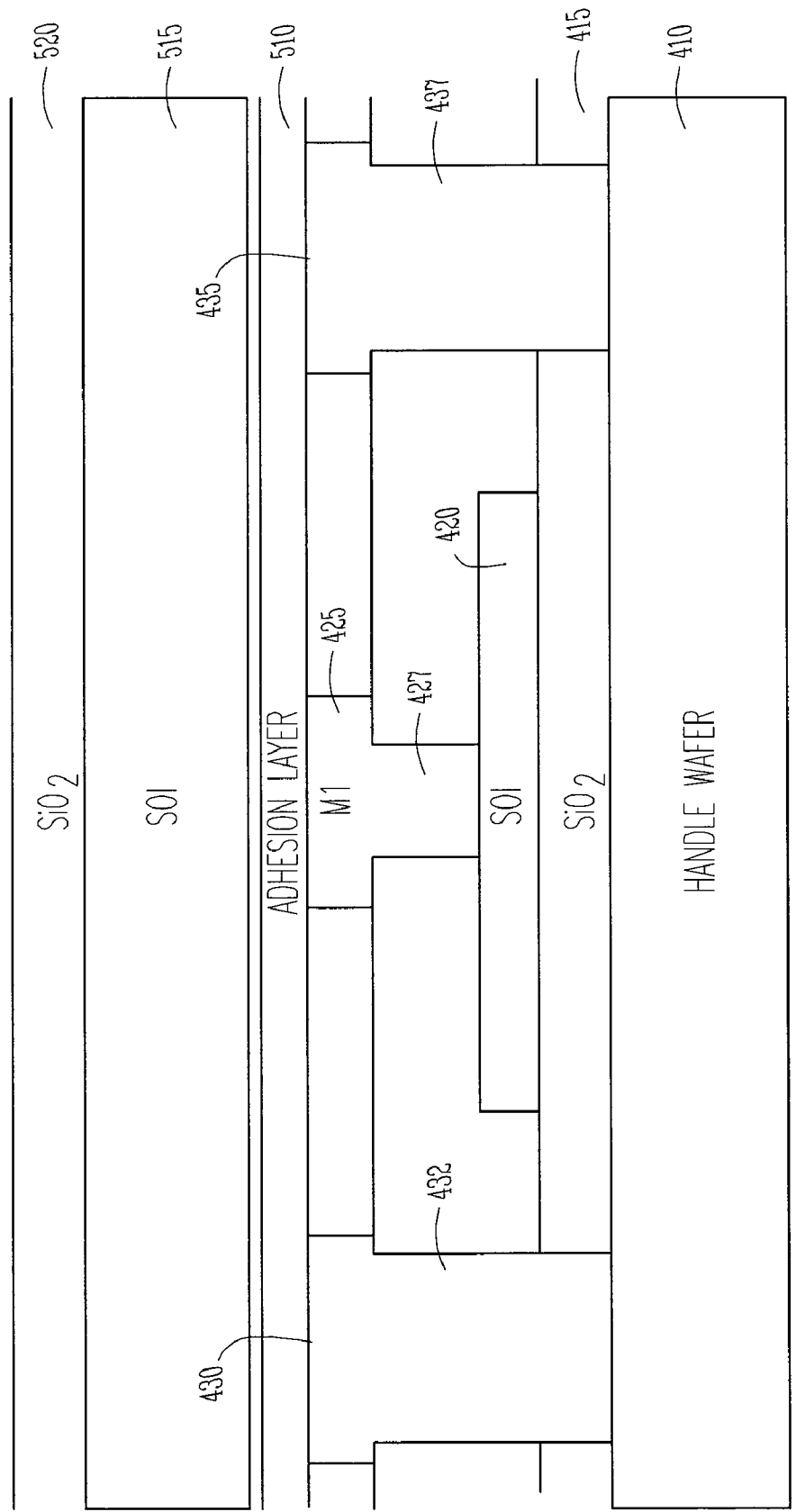
FIG. 6 is a block cross section diagram illustrating further steps in the alternative wafer preparation according to an example embodiment.

In FIG. 5, an adhesion layer 510 is formed over the CMOS circuitry to bond to a second SOI wafer having an SOI layer 515, a SiO$_2$ layer 520 and a second handle wafer 525. As shown in FIG. 6, the second handle wafer 525 is removed such as by grinding, polishing and etching to make the wafer ready for MEMS fabrication. MEMS devices may be formed after the wafers have been bonded in one embodiment, or prior to bonding. If done prior to bonding, the MEMS may be released after bonding to avoid damage to fragile MEMS devices during bonding steps.

Figure 7:
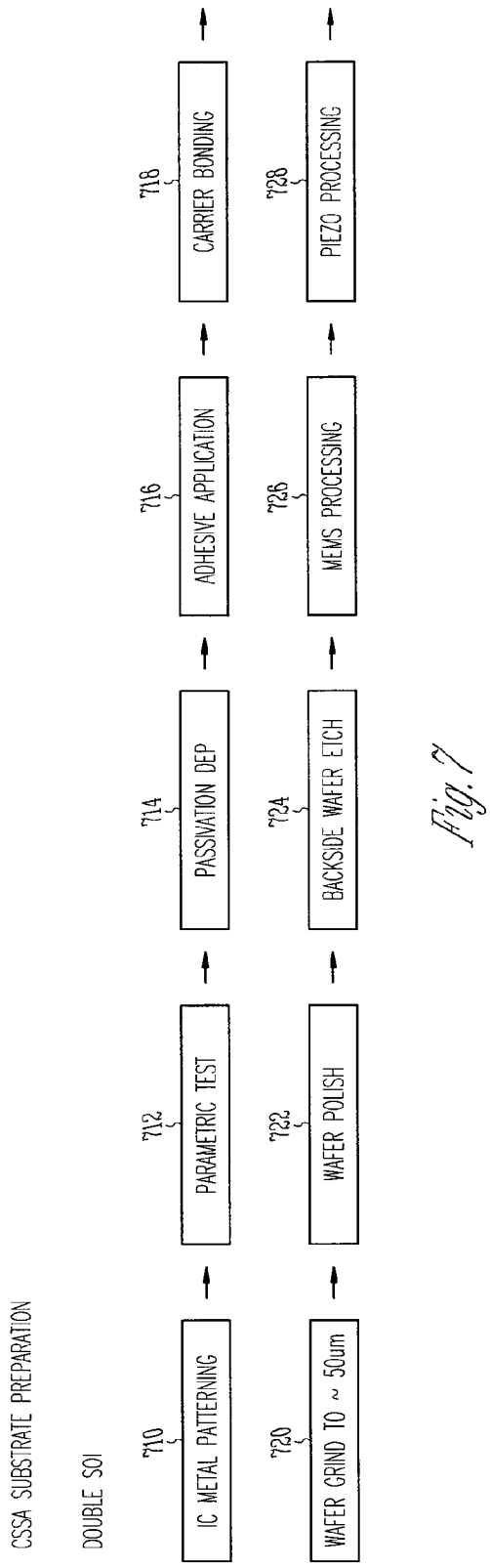
FIG. 7 is a process flow diagram illustrating wafer preparation for forming MEMS devices on the wafer according to an example embodiment.

Further below, a block flowchart in FIG. 7 illustrates substrate preparation and MEMS formation for the first embodiment above as described with respect to FIGS. 1-3. At 710, integrated circuit metal patterning is performed, followed by parametric testing at 712. The passivation layer is deposited at 714 and adhesive applied at 716. The carrier wafer is bonded at 718 and the handle wafer is ground down to approximately 50 μm at 720 in one embodiment. The remaining handle wafer is polished at 722 followed by a backside wafer etch at 724. MEMS processing is then done at 726 with piezoelectric processing done at 728. This is a high level view of the overall process.

A sequence of cross section drawings illustrating MEMS formation with associated process description is illustrated in FIGS. 8, 9, and 10. Again, the structure produced as shown in FIGS. 1-3 is utilized, with some of the last steps in the formation of such structure included in FIG. 8. With the handle wafer still attached as indicated at 810, the dual SOI layers are shown, along with metal thru pads or contacts formed of Tungsten in one embodiment, and a poly-2 shell formed over the contacts. At 812, the handle wafer is bonded to the SOI wafer using a permanent bonding material, and at 814, the SOI handle wafer is removed to an MBOX (MEMS buried oxide) layer. At 816, the structure is patterned for the formation of a mass for forming a MEMS devices such as a resonant structure formed of silicon. Patterning may be done using a dry reactive ion etch (DRIE) in one embodiment. At 818, TEOS fill trenches are formed and chemical mechanical polish to the silicon surface is performed.

At 820, an AlN process is performed such as one commonly done by Berkley, is done on the wafers to form an AlN layer. At 822, a polyimide coat is formed and patterned. The resulting pattern may be sealed with a material such as TEOS.

Continuing processing as illustrated in FIG. 9, the TEOS and AlN are cut through to MSI (MEMS silicon). An etch through the MSI is done at 912 for future pad contacts. At 914, a blanket etch of the TEOS to polyimide and tungsten pads is done to the bottom of the TMAH (Tetramethylammonium hydroxide) vias. At 916, an etch of the polyimide is done to expose an electrical and mechanical interface to MEMS components: piezoelectric contacts and paths for tethers respectively. The polyimide and silicon sidewalls are capped with silicon nitride at 918. Nitride vias are cut to the tungsten SOI pad, piezoelectric pads and oxide trenches, being careful not to expose silicon areas where the tether metal may be.

Continuing in FIG. 10, a lift off of the deposited tether metal and contacts to CMOS is done, followed by an HF:water etch to release the MEMS structure at 1012. At 1014, an etch of the blanket nitride is done to expose the polyimide, and at 1016, a blanket O2 plasma is used to clear the polyimide, ending the process.

In some embodiments, the combination of CMOS circuitry and MEMS devices may be used in radio frequency applications. The CMOS circuitry may include drivers and circuitry to process signals for sending and receiving RF signals. The MEMS devices may include RF components like capacitors, inductors, crystal oscillators or surface acoustic wave devices that are utilized in RF communications. Combining the RF components and CMOS circuitry on a single chip provide for cheaper and more compact devices.

The Abstract is provided to comply with 37 C.F.R. §1.72(b) to allow the reader to quickly ascertain the nature and gist of the technical disclosure. The Abstract is submitted with the understanding that it will not be used to limit the scope or meaning of the claims.

The invention claimed is:

1. A semiconductor chip comprising:
   a CMOS circuit supported by a first wafer comprising a first silicon on insulator layer a first silica layer; and
   a second wafer, comprising a second silicon on insulator layer and a second silica layer, bonded to the first wafer on the side of the first wafer supporting the CMOS circuit, wherein a portion of the first or second wafer is removed to expose a MEMS formation layer separated from the CMOS circuit by at least one silicon on insulator layer; and wherein at least one of the first or second wafers has a handle wafer.

2. The semiconductor chip of claim 1 wherein the second wafer is separated from the CMOS circuitry by a passivation layer.

3. The semiconductor chip of claim 1 wherein the first wafer comprises a third silicon on insulator layer.

4. The semiconductor chip of claim 1 and further comprising
   at least one MEMS device formed in the MEMS formation layer; and
   at least one electrical contact formed between the at least one MEMS device and the CMOS circuit.

5. A semiconductor chip comprising:
   a first CMOS circuit in a CMOS layer having a first contact extending to a first silicon on insulator layer of a first wafer, the first wafer including a first silica layer;
   a second CMOS circuit in the CMOS layer having a second contact extending to a second silicon on insulator layer of the first wafer, wherein the second silicon on insulator layer and first silicon on insulator layers are separated by an insulating layer;
   an adhesion layer supported by the CMOS layer;
   a second wafer, including a third silicon on insulation layer and a second silica layer, bonded to the adhesion layer of the first wafer, wherein a portion of the first or second wafer is removed to expose a MEMS formation layer separated from the first CMOS circuit by at least one silicon on insulator layer; and wherein at least one of the first or second wafers has a handle wafer.

6. The semiconductor chip of claim 5 and further comprising a passivation layer formed between the adhesion layer and the CMOS layer to form a passivated CMOS circuit first wafer.

7. The semiconductor chip of claim 5 and further comprising
   at least one MEMS device formed in the MEMS formation layer; and
   at least one electrical contact formed between the at least one MEMS device and the first CMOS circuit.

8. The semiconductor chip of claim 7 wherein the at least one MEMS device includes a released moveable structure.

9. The semiconductor chip of claim 7 wherein the at least one MEMS device comprises an RF oscillator.

10. The semiconductor chip of claim 7 wherein the MEMS formation layer comprises a silicon on insulator layer of the first wafer.

11. The semiconductor chip of claim 7 wherein the MEMS formation layer comprises a layer of the second wafer separated from the CMOS layer by a silicon on insulator layer.

12. A semiconductor chip comprising:
a CMOS circuit supported by a first wafer comprising a first silicon on insulator layer and a first silica layer; and
a second wafer, comprising a second silicon on insulator layer and a second silica layer, bonded to the first wafer on the side of the first wafer supporting the CMOS circuit, wherein at least one of the first or second wafers has a handle wafer, removal of which will expose a MEMS formation layer separated from the CMOS circuit by at least one silicon on insulator layer.

* * * * *